(12) United States Patent
Manohara et al.

(10) Patent No.: US 8,796,932 B2
(45) Date of Patent: Aug. 5, 2014

(54) MICROSCALE DIGITAL VACUUM ELECTRONIC GATES

(71) Applicant: California Institute of Technology, Pasadena, CA (US)

(72) Inventors: Harish Manohara, Arcadia, CA (US); Mohammed M. Mojarradi, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/796,943

(22) Filed: Mar. 12, 2013

(65) Prior Publication Data
US 2013/0249598 A1      Sep. 26, 2013

Related U.S. Application Data

(60) Provisional application No. 61/614,319, filed on Mar. 22, 2012.

(51) Int. Cl.
| | |
|---|---|
| *H05H 1/48* | (2006.01) |
| *H03K 19/06* | (2006.01) |
| *B82Y 99/00* | (2011.01) |
| *H01L 29/06* | (2006.01) |
| *B82Y 10/00* | (2011.01) |

(52) U.S. Cl.
CPC ............... *H03K 19/06* (2013.01); *B82Y 99/00* (2013.01); *H01L 29/0676* (2013.01); *B82Y 10/00* (2013.01)
USPC ........................................ 315/111.01; 315/10

(58) Field of Classification Search
USPC ............. 315/39, 10, 111.01, 111.21, 5, 5.36, 315/5.41, 5.43, 3.5, 5.14, 5.33, 111.31, 315/111.81
See application file for complete search history.

(56) References Cited

U.S. PATENT DOCUMENTS

| 2003/0036244 A1 | 2/2003 | Jones et al. | |
|---|---|---|---|
| 2008/0061700 A1* | 3/2008 | Blick | 315/5 |

(Continued)

FOREIGN PATENT DOCUMENTS

WO          2013142246 A1      9/2013

OTHER PUBLICATIONS

Chen, B. X. et al., "Approximate Calculating Methods Concerning the Electron Transit Time for a Vacuum Microelectronics Triode," J. Phys. D: Appl. Phys 33 (2000) L39-L43, Nov. 24, 1999.

(Continued)

*Primary Examiner* — Jimmy Vu
(74) *Attorney, Agent, or Firm* — KPPB LLP (57) ABSTRACT

Systems and methods in accordance with embodiments of the invention implement microscale digital vacuum electronic gates. In one embodiment, a microscale digital vacuum electronic gate includes: a microscale field emitter that can emit electrons and that is a microscale cathode; and a microscale anode; where the microscale field emitter and the microscale anode are disposed within at least a partial vacuum; where the microscale field emitter and the microscale anode are separated by a gap; and where the potential difference between the microscale field emitter and the microscale anode is controllable such that the flow of electrons between the microscale field emitter and the microscale anode is thereby controllable; where when the microscale anode receives a flow of electrons, a first logic state is defined; and where when the microscale anode does not receive a flow of electrons, a second logic state is defined.

29 Claims, 8 Drawing Sheets

(56) References Cited

U.S. PATENT DOCUMENTS

| | | |
|---|---|---|
| 2008/0180883 A1 | 7/2008 | Palusinski et al. |
| 2010/0009511 A1 | 1/2010 | Quinlan et al. |
| 2010/0085672 A1 | 4/2010 | Savin et al. |
| 2010/0264032 A1 | 10/2010 | Bazant |
| 2013/0247678 A1 | 9/2013 | Manohara et al. |
| 2013/0250479 A1 | 9/2013 | Manohara et al. |

OTHER PUBLICATIONS

Ghosh et al., "Nanodiamond lateral field emission vacuum logic OR gate", Electronics Letters, Aug. 4, 2011, vol. 47, No. 16, 2 pgs.

Grzybowski, et al., "High Temperature Performance of Polymer Film Capacitors", Journal of Microelectronic Packaging, 1998, pp. 711-716.

Manohara, et al., "Carbon Nanotube-Based Digital Vacuum Electronics and Miniature Instrumentation for Space Exploration", Proc. of SPIE vol. 7594, 75940Q-1, Apr. 13, 2010.

Manohara, et al., "Carbon Nanotube-Based High Temperature Vacuum Microelectronics for E&P Applications", SPE 156947, Jun. 12, 2012.

Manohara et al., "11.2: "Digital" Vacuum Microelectronics: Carbon Nanotube-Gased Inverse Majority Gates for High Temperature Applications", IEEE, 2010, pp. 203-204.

Nusil Silicone Technology LLC, "Conductive Silicones in Elevated Temperatures", 5 pgs.

Search Report & Written Opinion, "International Application PCT/US2013/031285, completed Jun. 26, 2013, 9 pgs."

Sergent, "Discrete Passive Components for Hybrid Circuits, Chapter 8, 40 pgs."

Wacker, "High-Performance Silicones for Transmission and Distribution", 52 pgs.

Zhang et al., "Lateral vacuum microelectronic logic gate design", J. Micromech. Microeng., 1991, pp. 126-134.

\* cited by examiner

MICROSCALE DIGITAL VACUUM ELECTRONIC GATES

STATEMENT OF FEDERAL FUNDING

The invention described herein was made in the performance of work under a NASA contract, and is subject to the provisions of Public Law 96-517 (35 U.S.C. 202) in which the Contractor has elected to retain title.

CROSS-REFERENCE TO RELATED APPLICATIONS

The current application claims priority to U.S. Provisional Application No. 61/614,319, filed Mar. 22, 2012, the disclosure of which is incorporated herein by reference.

FIELD OF THE INVENTION

The present invention generally relates to vacuum electronics.

BACKGROUND

Vacuum electronics is a broad term that typically references applying principles of electron emission in the context of a vacuum to create electronic devices. For example, diodes and triodes have been fabricated using the principles of vacuum electronics. Vacuum electronics technology has advanced to the stage where microscale digital vacuum electronics have been achieved. Still, current microscale digital vacuum electronics exhibit some deficiencies. For example, in many instances, the manufacture of current microscale digital vacuum electronics is unduly complex, and the overall yield is adversely affected. Therefore, there exists a need for better, more practicable microscale digital vacuum electronic devices.

SUMMARY OF THE INVENTION

Systems and methods in accordance with embodiments of the invention implement microscale digital vacuum electronic gates. In one embodiment, a microscale digital vacuum electronic gate includes: a microscale field emitter that can emit electrons and that is a microscale cathode; and a microscale anode; where the microscale field emitter and the microscale anode are disposed within at least a partial vacuum; where the microscale field emitter and the microscale anode are separated by a gap; and where the potential difference between the microscale field emitter and the microscale anode is controllable such that the flow of electrons between the microscale field emitter and the microscale anode is thereby controllable; where when the microscale anode receives a flow of electrons, a first logic state is defined; and where when the microscale anode does not receive a flow of electrons, a second logic state is defined.

In another embodiment, the microscale field emitter comprises a carbon nanotube.

In yet another embodiment, the microscale field emitter comprises a bundle of carbon nanotubes.

In still another embodiment, the diameter of the bundle of carbon nanotubes is between approximately 1 µm and approximately 2 µm.

In still yet another embodiment, the microscale field emitter comprises an aggregate of bundles of carbon nanotubes.

In a further embodiment, the diameter of the aggregate of bundles of carbon nanotubes is approximately 100 µm.

In a still further embodiment, the carbon nanotubes are coated with an atomic layer.

In a yet still further embodiment, the coated atomic layer comprises one of: tungsten, molybdenum, and mixtures thereof.

In an even further embodiment, the microscale digital vacuum electronic gate further includes a resistor electrically coupled to the microscale anode.

In another embodiment, the partial vacuum has a pressure of no greater than approximately $10^{-4}$ torr.

In a further embodiment, the partial vacuum is maintained using one of: a quartz vacuum bulb package; a specialized glass bulb package; chip scale packaging using standard multi-pin IC packages.

In a still further embodiment, the potential difference is controlled by a signal that is electrically coupled to the microscale field emitter.

In another embodiment, the microscale digital vacuum electronic gate includes a silica gel that is coupled to bundle of carbon nanotubes to hinder undesired displacement of the carbon nanotubes during operation of the microscale digital vacuum electronic gate.

In yet another embodiment, the microscale digital vacuum electronic gate includes a conductive structure that is coated with an oxide layer.

In still another embodiment, the size of the microscale digital vacuum electronic gate is such that its footprint is less than approximately 100 square micrometers.

In another embodiment, a microscale digital vacuum electronic logic circuit includes: at least one microscale digital vacuum electronic gate, each comprising: a microscale field emitter that can emit electrons and that is a microscale cathode; and a microscale anode; where the microscale field emitter and the microscale anode are disposed within at least a partial vacuum; where the microscale field emitter and the microscale anode are separated by a gap; where the potential difference between the microscale field emitter and the microscale anode is controllable such that the flow of electrons between the microscale field emitter and the microscale anode is thereby controllable; where when the microscale anode receives a flow of electrons, a first logic state is defined; and where when the microscale anode does not receive a flow of electrons, a second logic state is defined; at least one resistor; where at least one microscale digital vacuum electronic gate and at least one resistor are electrically interconnected such that the combination of at least one microscale digital vacuum electronic gate and at least one resistor operates as a logic gate.

In yet another embodiment, the combination of at least one microscale digital vacuum electronic gate and at least one resistor operates as at least one logic gate selected from the group consisting of: AND Gate, OR Gate, NAND Gate, NOR Gate, and NOT gate.

In et still another embodiment, the microscale digital vacuum electronic logic circuit includes: a first microscale digital vacuum electronic gate; and a second microscale digital vacuum electronic gate; where the microscale anode of the first microscale digital vacuum electronic gate is electrically coupled to the microscale anode of the second microscale digital vacuum electronic gate such that the two respective microscale anodes are at substantially the same electric potential; where a resistor is electrically coupled to the electrically coupled anodes; where the combination of the first microscale digital vacuum electronic gate, the second microscale digital vacuum electronic gate, and the resistor is defined to be a microscale digital vacuum AND gate; where when either the first microscale digital vacuum electronic gate or the second microscale digital vacuum electronic gate is in a first logic state, then the microscale digital vacuum AND gate is defined to be in a first logic state; and where when both the first microscale digital vacuum electronic gate and the second microscale digital vacuum electronic gate are in a second logic state, then the microscale digital vacuum AND gate is defined to be in a second logic state.

In a further embodiment, the potential difference between the microscale field emitter of the first microscale digital vacuum electronic gate and the electrically coupled microscale anodes is controlled by a first signal; and the potential difference between the microscale field emitter of the second microscale digital vacuum electronic gate and the electrically coupled microscale anodes is controlled by a second signal.

In a still further embodiment, a microscale digital vacuum electronic logic circuit further includes: a first microscale digital vacuum electronic gate; and a second microscale digital vacuum electronic gate; where the microscale field emitter of the first microscale digital vacuum electronic gate is electrically coupled to the microscale field emitter of the second microscale digital vacuum electronic gate such that the two respective microscale field emitters are at substantially the same electric potential; where a resistor is electrically coupled to the electrically coupled field emitters; where the combination of the first microscale digital vacuum electronic gate, the second microscale digital vacuum electronic gate, and the resistor is defined to be a microscale digital vacuum OR gate; where when both the first microscale digital vacuum electronic gate and the second microscale digital vacuum electronic gate are in a first logic state, then the microscale digital vacuum OR gate is defined to be in a first logic state; and where when either the first microscale digital vacuum electronic gate or the second microscale digital vacuum electronic gate is in a second logic state, then the microscale digital vacuum OR gate is defined to be in a second logic state.

In a yet further embodiment, the potential difference between the electrically coupled microscale field emitters and the microscale anode of the first microscale digital vacuum electronic gate is controlled by a first signal; and the potential difference between the electrically coupled microscale field emitters and the microscale anode of the second microscale digital vacuum electronic gate is controlled by a second signal.

In an even further embodiment, the microscale anode of a microscale digital vacuum electronic gate is electrically coupled to a resistor's first terminal; where a voltage source is electrically coupled to the resistor's second terminal; where the combination of the microscale digital vacuum electronic gate, the resistor, and the voltage source is defined to be a microscale digital vacuum NOT gate; where when the microscale digital vacuum electronic gate is in a second logic state, the microscale digital vacuum NOT gate is defined to be in a first logic state; where when the microscale digital vacuum electronic gate is in a first logic state, the microscale digital vacuum NOT gate is defined to be in a second logic state.

In a yet further embodiment, the potential difference between the microscale field emitter of the microscale digital vacuum electronic gate and the microscale anode of the microscale digital vacuum electronic gate is controlled by a signal.

In another embodiment, a microscale digital vacuum AND logic gate includes: at least two microscale digital vacuum electronic gates, each comprising: a microscale field emitter that can emit electrons and that is a microscale cathode; and a microscale anode; where the microscale field emitter and the microscale anode are disposed within at least a partial vacuum; where the microscale field emitter and the microscale anode are separated by a gap; where the potential difference between the microscale field emitter and the microscale anode is controllable such that the flow of electrons between the microscale field emitter and the microscale anode is thereby controllable; where when the microscale anode receives a flow of electrons, a first logic state is defined; and where when the microscale anode does not receive a flow of electrons, a second logic state is defined; where the microscale anode of a first microscale digital vacuum electronic gate is electrically coupled to the microscale anode of a second microscale digital vacuum electronic gate such that the microscale anodes are at substantially the same electric potential; where a resistor is electrically coupled to the electrically coupled microscale anodes; where when either the first microscale digital vacuum electronic gate or the second digital vacuum electronic gate is in a first logic state, then the microscale digital vacuum AND gate is defined to be in a first logic state; and where when both the first microscale digital vacuum electronic gate and the second microscale digital vacuum electronic gate are in a second logic state, then the microscale digital vacuum AND gate is defined to be in a second logic state.

I a further embodiment, the potential difference between the first microscale field emitter and the electrically coupled microscale anodes is controlled by a first signal; and the potential difference between the second microscale field emitter and the electrically coupled microscale anodes is controlled by a second signal.

In another embodiment, a microscale digital vacuum OR gate includes at least two microscale digital vacuum electronic gates, each comprising: a microscale field emitter that can emit electrons and that is a microscale cathode; and a microscale anode; where the microscale field emitter and the microscale anode are disposed within at least a partial vacuum; where the microscale field emitter and the microscale anode are separated by a gap; where the potential difference between the microscale field emitter and the microscale anode is controllable such that the flow of electrons between the microscale field emitter and the microscale anode is thereby controllable; where when the microscale anode receives a flow of electrons, a first logic state is defined; and where when the microscale anode does not receive a flow of electrons, a second logic state is defined; where the microscale field emitter of a first microscale digital vacuum electronic gate is electrically coupled to the microscale field emitter of a second microscale digital vacuum electronic gate such that the microscale field emitters are at substantially the same electric potential; where a resistor is electrically coupled to the electrically coupled microscale field emitters; where when both the first microscale digital vacuum electronic gate and the second microscale digital vacuum electronic gate are in a first logic state, then the microscale digital vacuum OR gate is defined to be in a first logic state; and where when either the first microscale digital vacuum electronic gate or the second microscale digital vacuum electronic gate is in a second logic state, then the microscale digital vacuum OR gate is defined to be in a second logic state.

In a further embodiment, the potential difference between the electrically coupled microscale field emitters and the first microscale anode is controlled by a first signal; and the potential difference between the electrically coupled microscale field emitters and the second microscale anode is controlled by a second signal.

In another embodiment, a microscale digital vacuum NOT gate includes: a microscale digital vacuum electronic gates, itself comprising: a microscale field emitter that can emit electrons and that is a microscale cathode; and a microscale anode; where the microscale field emitter and the microscale anode are disposed within at least a partial vacuum; where the microscale field emitter and the microscale anode are separated by a gap; where the potential difference between the microscale field emitter and the microscale anode is controllable such that the flow of electrons between the microscale field emitter and the microscale anode is thereby controllable, where when the microscale anode receives a flow of electrons, a first logic state is defined; and where when the microscale anode does not receive a flow of electrons, a second logic state is defined; a resistor having a first terminal and a second terminal; a voltage source; where the resistor is electrically coupled to the microscale anode at its first terminal; where the resistor is electrically coupled to the voltage source at its second terminal; where when the microscale digital vacuum electronic gate is in a second logic state, then the microscale digital vacuum NOT gate is defined to be in a first logic state; and where when the microscale digital vacuum electronic gate is in a first logic state, then the microscale digital vacuum NOT gate is defined to be in a second logic state.

In a further embodiment, the potential difference between the microscale field emitter and the microscale field anode is controlled by a signal.

DETAILED DESCRIPTION

Turning now to the drawings, systems and methods for implementing advanced microscale digital vacuum electronic gates are illustrated. Although microscale digital vacuum electronics are known, their current manufacture exhibits a number of deficiencies. For example, H. Manohara et al. disclose the manufacture of a microscale digital vacuum inverse majority gate (H. Manohara et. al., *Proc. of SPIE*, Vol. 7594, pp. 75940Q-1 to 75940Q-5 (2010)), that implements a fairly complex structure including three sets of field emitters, three distinct gate electrode structures dividing the three sets of field emitters, and an overlaying anode that is split into three corresponding sections. The anode is divided into three sections so that the area of overlap can be reduced, and the Miller capacitance can be decreased. In this way, the inverse majority gate can achieve high speed operation. The complexity of such a structure can be disadvantageous from a fabrication perspective, and the growth of such a structure can be particularly challenging where the field emitters constitute monolithically integrated bundles of carbon nanotubes (CNTs). In general, the monolithic integration of CNTs within a microstructure that implements a non-planar surface topology can be challenging. For example, the CNTs within the bundles may grow unevenly and/or may inadvertently 'lean' and contact adjacent gates, thereby 'shorting' them.

Much of the challenge of fabricating microscale digital vacuum electronics lies in the intricacy of the underlying electronic device. For example, the inclusion of distinct gate electrodes within an electronic device can drastically increase fabrication complexity since the inclusion of distinct gate electrodes may require a separate fabrication step. Accordingly, many embodiments of the instant invention achieve microscale digital vacuum electronic gates that do not rely on distinct gate electrodes. Instead, in many embodiments, a cathode structure achieves the functionality of gate electrodes. For instance, in some embodiments, a microscale digital vacuum electronic gate includes: a microscale field emitter that can emit electrons and that is a microscale cathode; and a microscale anode; where the microscale field emitter and the microscale anode are disposed within at least a partial vacuum; where the microscale field emitter and microscale anode are separated by a gap; and where the potential difference between the microscale field emitter and microscale anode is controllable such that the flow of electrons between the microscale field emitter and microscale anode is thereby controllable; where when the microscale anode receives a flow of electrons, a first logic state is defined; and where when the microscale anode does not receive a flow of electrons, a second logic state is defined. In many embodiments, the microscale digital vacuum electronic gate is of a similar size as current generation standard CMOS-based electronic devices, e.g. transistors. In a number of embodiments the footprint of the microscale digital vacuum electronic gate is less than approximately 100 µm².

Figure 1A:
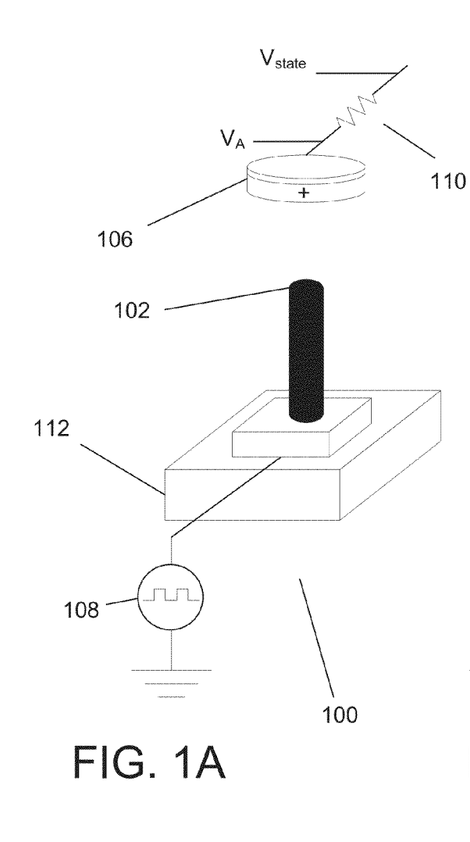
FIGS. 1A-1C illustrate the operation of a microscale digital vacuum electronic gate in accordance with embodiments of the invention.

FIG. 1A illustrates how a microscale field emitter and microscale anode can be interconnected to form a microscale digital vacuum electronic gate in accordance with embodiments of the invention. Briefly, in the illustrated embodiment, the microscale digital vacuum electronic gate 100 includes a microscale field emitter 102, a microscale anode 106, a voltage source 108, a resistor 110, and a dielectric substrate 112. The voltage source 108 can allow the potential difference between the field emitter and the anode to be controlled, such that the flow of electrons to the anode can be controlled and two distinct logic states can be achieved. Thus, the necessity of a distinct gate electrode is obviated; as the potential difference between the field emitter and the anode can be modulated so as to achieve the functionality of a distinct gate electrode.

Notably, in many embodiments the field emitter is achieved using CNTs. As the microscale digital vacuum electronic gates disclosed herein can employ less intricate structures than current microscale digital vacuum electronics, the incorporation of CNTs can be less problematic. Importantly, the incorporation of CNTs within a microscale digital vacuum electron gate is advantageous in a number of respects, including: CNTs can be compatible with high temperature operation; CNTs can function in poor vacuums (which may be unavoidable in microscale packages); and CNTs can emit a high current density and have a low turn-on voltage.

These microscale digital vacuum electronic gates can then be used as foundational elements in the construction of more advanced electronic devices, e.g. logic gates and logic circuits. The operation of the microscale digital vacuum electronic gate is now discussed in greater detail below.

Microscale Digital Vacuum Electronic Gate

As alluded to above, in many embodiments, a microscale digital vacuum electronic gate is achieved using a microscale field emitter that can emit electrons and that is a microscale cathode and a microscale anode, where the potential difference between the microscale field emitter and microscale anode is controllable such that the flow of electrons between the microscale field emitter and the microscale anode is thereby controllable. By controlling this flow of electrons, e.g. by controlling whether or not the anode receives electrons, particular logic states may be achieved. In many embodiments, the microscale digital vacuum electronic gate has a footprint of less than approximately 100 μm².

Referring back to FIG. 1A, it is illustrated how a microscale field emitter and a microscale anode may be interconnected to achieve a microscale digital vacuum electronic gate in accordance with a number of embodiments. In particular, the illustrated embodiment depicts a microscale field emitter 102 and a microscale anode 106 separated by a gap. The microscale field emitter is disposed on a dielectric substrate 112, and of course the microscale field emitter 102 and the microscale anode 106 are located in at least a partial vacuum. A partial vacuum is desirable since a current can more easily flow through a vacuum than a pressurized space; accordingly, a current can more easily be developed in the microscale anode. In many embodiments, a vacuum of at least $10^{-4}$ torr is used. However, any vacuum can be used so long as sufficient current density that can enable the functionality of the microscale digital vacuum electronic gate is achieved—any current density that can allow the microscale digital vacuum electronic gate to function may be acceptable in accordance with embodiments of the invention.

A voltage source 108 is coupled to the microscale field emitter 102, and can thereby control the potential difference between the microscale field emitter 102 and the microscale anode 106. By controlling the potential difference between the anode and field emitter, the flow of current through the anode can be controlled and two logic states can be established: a first logic state can be defined when current is flowing through the anode, and a second logic state can be defined when current is not flowing through the anode. The voltage source can of course be a signal. The microscale digital vacuum electronic gate includes a resistor 110, so that the logical state can be determined.

Figure 1B:
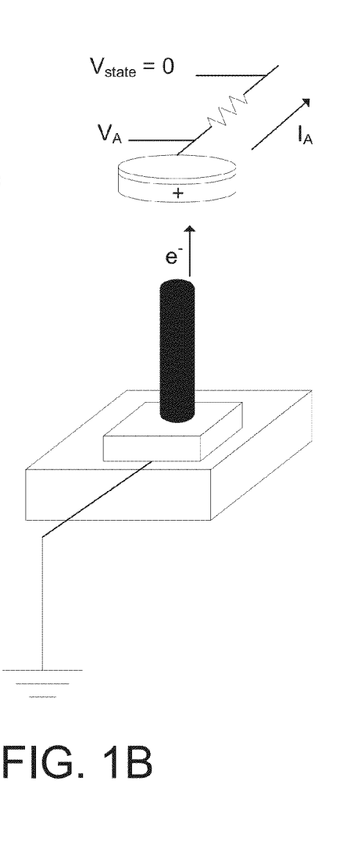
Figure 1C:
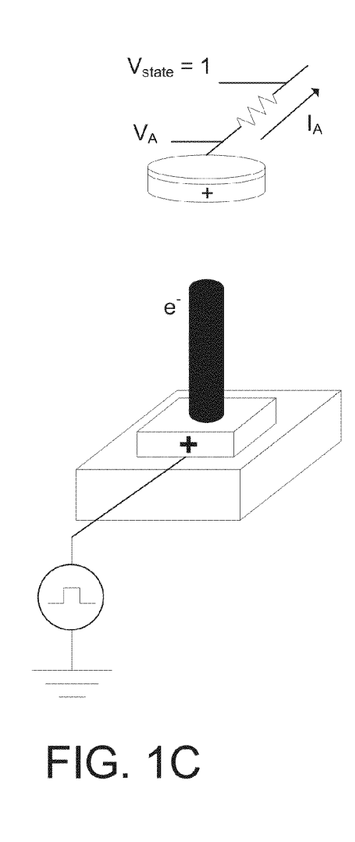

The operation of the microscale digital vacuum electronic gate is illustrated in FIGS. 1B and 1C. Specifically, FIG. 1B illustrates how a first logic state is achieved when the voltage source 108 'grounds' the field emitter. Accordingly, the potential difference between the microscale anode and the field emitter can exceed a threshold voltage and the field emitter emits electrons, and the electrons are drawn to the positively charged anode, and current is allowed to flow. The logical state, as reflected by $V_{state}$, can be determined in accordance with the equation:

$$V_{state}=V_A-I_AR$$

As current is flowing, $V_{state}$ corresponds with a logical state of 0.

FIG. 1C illustrates how a corresponding second logic state is achieved when the voltage source 108 establishes a positive voltage, such that the potential difference between the microscale anode and the microscale field emitter does not exceed a threshold voltage. In this instance, electrons emitted from the field emitter are not drawn to the anode. Hence, current does not flow through the anode. As a result, in accordance with the equation:

$$V_{state}=V_A-I_AR$$

$V_{state}=V_A$, which can be associated with a logical state of 1. In this way, a microscale digital electronic gate can be achieved.

This simplified electronic gate structure can confer a host of benefits. For example, the electronic gate can employ a substantially planar topology, as can be seen in FIGS. 1A-1C. As an example, in the illustrated embodiments, the only substantially protruding element is the field emitter. Conversely, conventional microscale digital vacuum electronics typically employ distinct gate electrodes, which also protrude from a substrate. For example, H. Manohara et al. disclose the manufacture of a microscale digital vacuum inverse majority gate (IMG) (H. Manohara et. al., *Proc. of SPIE*, Vol. 7594, pp. 75940Q-1 to 75940Q-5 (2010)), that implements a fairly complex structure including three distinct gate electrode structures dividing three sets of field emitters. Note also that H. Manohara et al. disclose that the field emitters consist of CNTs (Id.); the growth of CNTs is challenging when having to develop them within a perimeter of distinct gate electrodes and in a confined space—which is what H. Manohara et al.'s IMG requires. For example, in many instances, CNTs within bundles may grow unevenly. Additionally, they may grow at an angle that deviates from the desired angle. In cases where CNTs exist within a perimeter of gate electrodes, the CNTs may thereby undesirably interfere with the perimeter gate electrodes and cause them to short circuit. With the removal of distinct gate electrode structures and the implementation of a planar topology, the fabrication yield and process optimization of microscale digital vacuum electronic gates can be substantially increased. For example, any heterogenous growth in the CNTs or any deviation in the angle of growth may have less of an adverse effect on the functionality of the electronic device that implements a substantially planar topology. Additionally, the fabrication of these electronic gates can also be enhanced, since they do not require a separate fabrication step to construct the distinct gate electrodes. Moreover, the simplified electronic structure lends itself to the monolithic fabrication of a large number of gates. This can further enhance the manufacturing yield of the electronic gates. Accordingly, that the development of a microscale digital vacuum electronic gate can be implemented within a planar topology is a non-trivial aspect of many embodiments of the invention. Although, of course, it is not requisite that the topology of the microscale digital vacuum electronic gate is planar; in many embodiments, a microscale digital vacuum electronic gate is achieved that is not planar.

Finally, with the simplified microscale digital vacuum electronic gates disclosed, the intrinsic capacitances within the electronic gates can be reduced significantly such that the frequency of operation becomes virtually dependent on the electron transit time. This is at least partly because there is no distinct gate electrodes to influence this parameter. For example, the frequency of operation in a conventional microscale digital vacuum electronic device that employs distinct gate electrodes may be a function of intrinsic capacitances between the distinct gate electrode structure and the cathode, and the intrinsic capacitance between the distinct gate electrode structure and the anode. This is because the combination of the gate electrodes and the anodes/cathodes respectively act as parallel plate capacitors, and can thereby store charge. Accordingly, when a switching signal is received, any charge that has been stored in the "parallel plate capacitors" that is the gate electrode and the anode/cathode has to be discharged before the switch is registered by the electronic gate. Thus, the time spent discharging can hinder the frequency of operation.

However, as many embodiments of the current invention do not utilize distinct gate electrode structures, their frequency of operations is not burdened by these inter-electrode capacitances. Accordingly, the frequency of operations can be largely determined by the electron transit time. It can be approximated by the following formula:

$$f=1/(d(2*m_e/\in)^5)$$

where:
 f is the frequency
 d is the distance between the cathode and the anode;
 $m_e$ is the mass of an electron; and
 and $\in$ is energy, which is a function of the applied field.

Thus, it is clear that microscale digital vacuum electronic gates in accordance with many embodiments can confer numerous benefits. The efficacy of these electronic gates is at least partly a function of the constituent components. Principal amongst these components is the field emitter, and this is discussed in greater detail below.

Microscale Field Emitter

In many embodiments, a microscale field emitter is utilized within a microscale digital vacuum electronic gate as a source of electrons. Field emitters typically emit electrons when they are subject to a sufficiently strong electric field. In the context of a microscale digital vacuum electronic gate, field emitters typically do not have to emit a high current density in order for the electronic gate to function. Any current density that can allow the microscale digital vacuum electronic gate to function may be acceptable in accordance with embodiments of the invention. It is also desirable for field emitters to be tolerant of high temperature operation. In particular, vacuum electronics are at least partly advantageous relative to solid state electronics, e.g. transistors, because of their ability to operate at a high temperature. It is thereby desirable that a constituent field emitter can also withstand high temperature operation. Furthermore, it is desirable that the field emitter be radiation insensitive. Microscale digital vacuum electronics have been considered for extraterrestrial operation, where radiation insensitivity may be an advantageous, if not requisite, characteristic for electronics components. It may further be desirable that the field emitter component be readily capable of manufacture and compatible with a micro-assembly/micromachining process. It may also be desirable that the field emitter be able to operate within an imperfect vacuum. The tolerance of imperfection can increase overall manufacturing yield.

Figure 2:
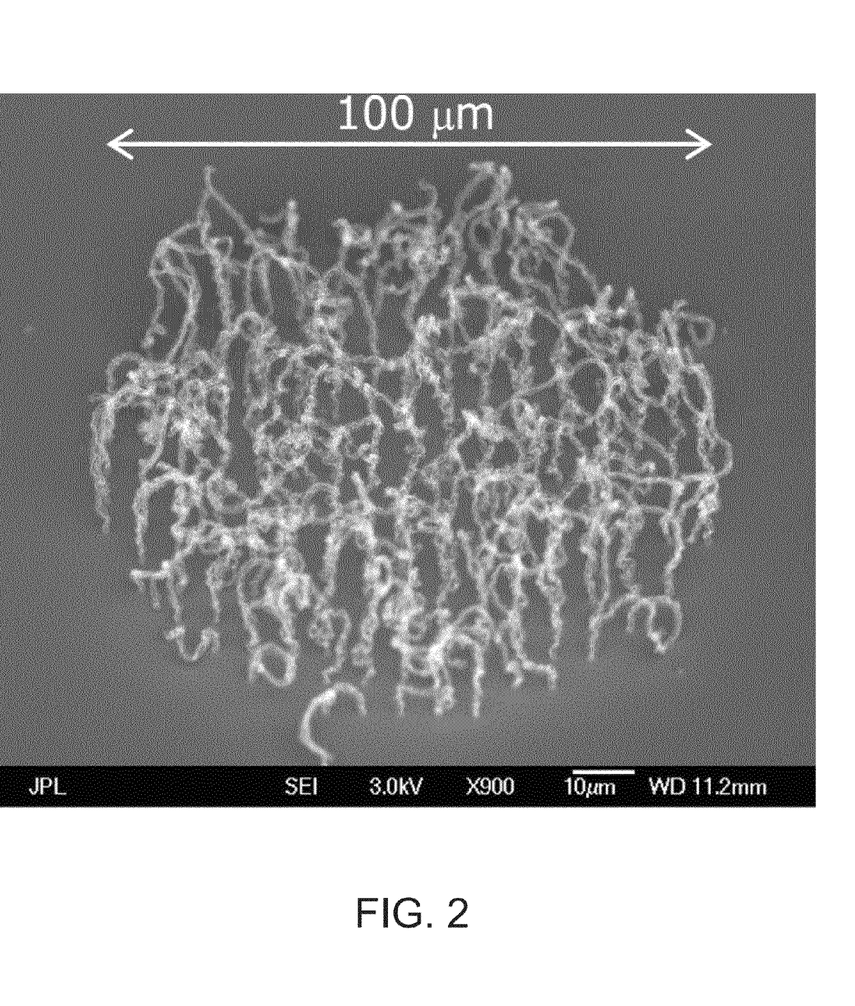
FIG. 2 illustrates a bundle of CNTs that can be utilized as a field emitter in accordance with embodiments of the invention.
Figure 3:
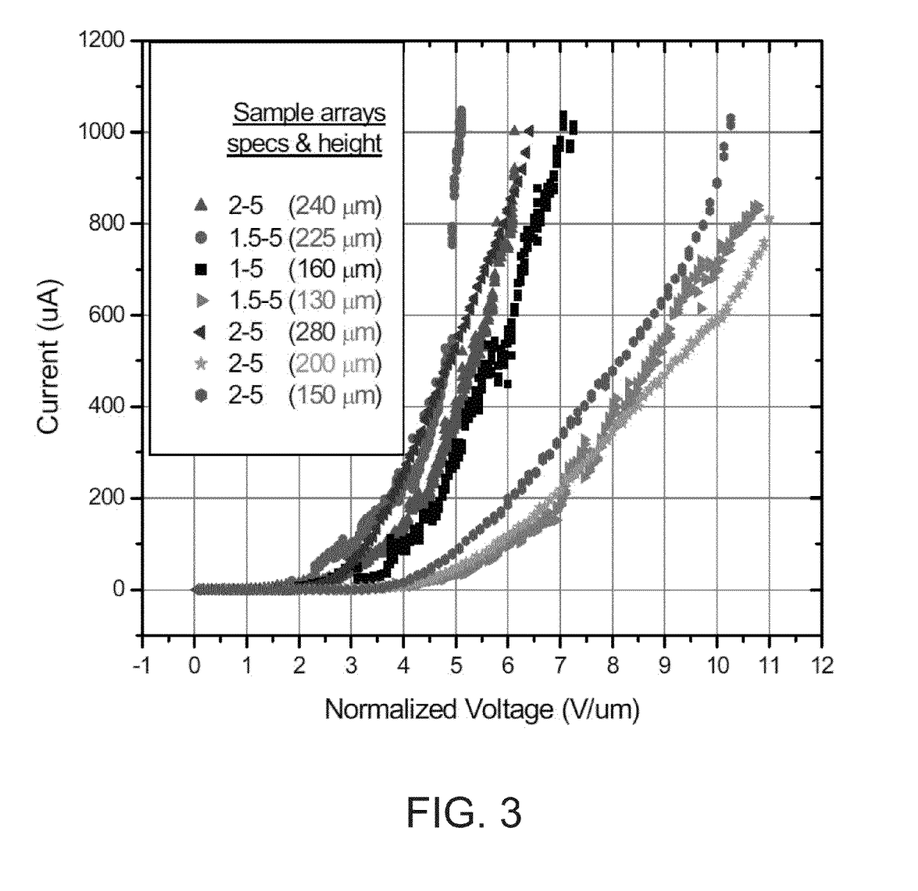
FIG. 3 illustrates the current densities that can be achieved using CNTs in accordance with embodiments of the invention.

In many embodiments, carbon nanotubes (CNTs) are used to implement the field emitters. CNTs exhibit many, if not all, of the above described desirable traits. For example, bundles of CNTs of 1-2 µm in diameter have been shown to be capable of producing a current density of between approximately 10 and 25 A/cm² at applied electric fields of between approximately 5 and 10 V/µm. In many embodiments, a bundle of CNTs with a diameter that is between approximately 50 nm to approximately 100 nm is used in implementing the field emitter. Reducing the diameter to this range can increase the switching speed of devices that employ these CNTs as a field emitter. Aggregates of bundles of CNTs may also be used in microscale digital vacuum electronic gate in accordance with many embodiments, and the aggregates can be of any suitable diameter. FIG. 2 illustrates a 100 µm diameter aggregate of bundles of CNTs that can be implemented within a microscale digital vacuum electronic gate in accordance with embodiments of the invention. FIG. 3 depicts a graph that illustrates the repeatability of achieving viable current densities using CNTs.

Figure 4:
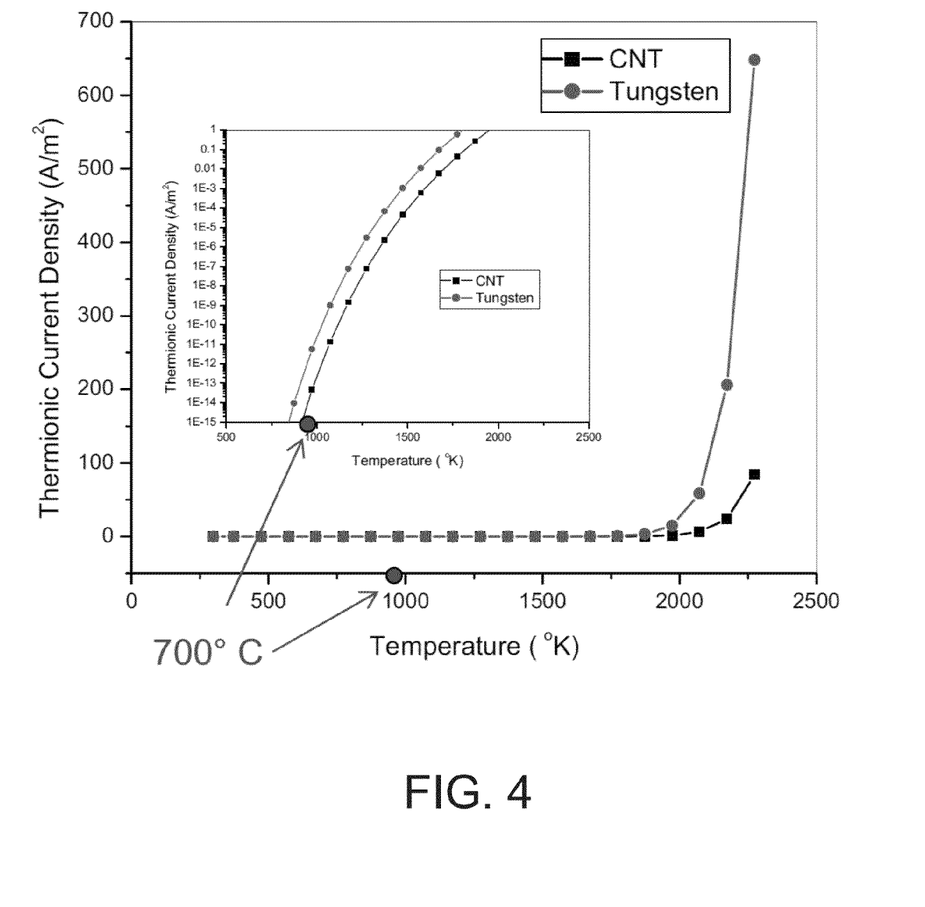
FIG. 4 illustrates the thermionic current densities of CNTs that can be used as a field emitter in accordance with embodiments of the invention.

Additionally, given that CNTs are typically synthesized at temperatures between approximately 650° C. and 900° C., CNTs have demonstrated high temperature tolerance. The synthesis of CNTs has been previously documented (see e.g., H. Manohara et al., "High-current-density field emitters based on arrays of carbon nanotube bundles," *Journal of Vacuum Science and Technology B*, Vol. 23(1), 157-161 (2005)). Note that even at high temperature operation, the predominant mechanism of electron emission from CNTs is the field emission process than thermionic process. This is important because the field emission process is necessary to achieve logic gate operation. For example, FIG. 4 illustrates a graph depicting the thermionic properties of CNTs. As can be seen, the thermionic current density of CNTs is largely negligible at below approximately 1750 K (or approximately 1480° C.). It has been determined that in many embodiments, microscale digital vacuum electronic gates that incorporate CNTs as field emitters operate well at a temperature range of approximately 200° C. to approximately 750° C. Additionally, CNTs are substantially radiation insensitive. In many embodiments the CNTs are coated via atomic layer deposition (ALD) to further shield them from unwanted thermal effects. For example, if the temperature within the microscale digital vacuum electronic gate becomes sufficiently high, any trace oxygen atoms and/or molecules within an imperfect vacuum may result in the formation of a carbon-oxide (e.g. $CO_2$). As one example, Tungsten may be deposited via ALD to shield the CNTs. Note that FIG. 4 also depicts the thermionic stability of Tungsten, and shows how it is also thermionically stable and predominantly field emitting at designed high temperatures of operation (<1025 K). Molybdenum may also be used to shield the CNTs.

Additionally, CNTs are sufficiently radiation-insensitive, and have been shown to be operable in as field emitters within imperfect vacuums. For example, CNTs can function as field emitters in a vacuum of approximately $10^{-4}$ torr.

When CNTs are used as field emitters, they may be advantageously developed so that they can operate more robustly. In particular, CNTs may risk being at least partially dislodged during operation due to an applied electric field or thermal stresses; this can impact emission characteristics. Additionally, because of the potential for unintended displacement, it is preferable that digital vacuum electronic devices that employ CNTs not have adjacent conductive structures that risk being contacted by displaced CNTs, and employ a planar topology (as alluded to before). To mitigate the possibilities of inadvertent CNT displacement, in many embodiments, a silica gel is used in conjunction with the CNTs to anchor the CNTs such that an applied electric field and/or thermal stresses do not undesirably displace the CNTs and thereby adversely impact the emission characteristics. In particular, the silica gel is used to anchor a bundle of CNTs so that an applied electric field does not distort their structure and thereby impact emission characteristics. Moreover, in many embodiments, an isolated CNT is used that is grown from plasma enhanced chemical vapor deposition techniques such that it is structurally more rigid. The enhanced structural rigidity inhibits any displacing forces resulting from applied electric fields and/or thermal stresses.

Moreover, even in the case where the topology is not planar and there exist distinct conductive structures in the immediate proximity of CNTs, the manufacturing processes can still be modified to allow the incorporation of CNTs to be viable. For example, in many embodiments, distinct conductive structures within a microscale digital vacuum electronic device can be insulated via an oxide layer prior to the growth of any CNTs. In this way, the conductive structures can be protected against CNTs that are inadvertently grown so that they contact the conductive structure.

Of course it should be understood that any suitable field emitter can be implemented in accordance with embodiments of the invention—not just those fabricated from CNTs. For example, traditional sharp tip micro-cathodes may be used as field emitters. Similarly, where CNTs are used as field emitters, CNTs may be coated with any number of elements using an atomic layer deposition process, not just tungsten or molybdenum. Any of a variety of suitable packaging materials can be used to package the microscale digital vacuum electronic gates, and this is now discussed.

Packaging of Microscale Digital Vacuum Electronic Gates

Figure 5:
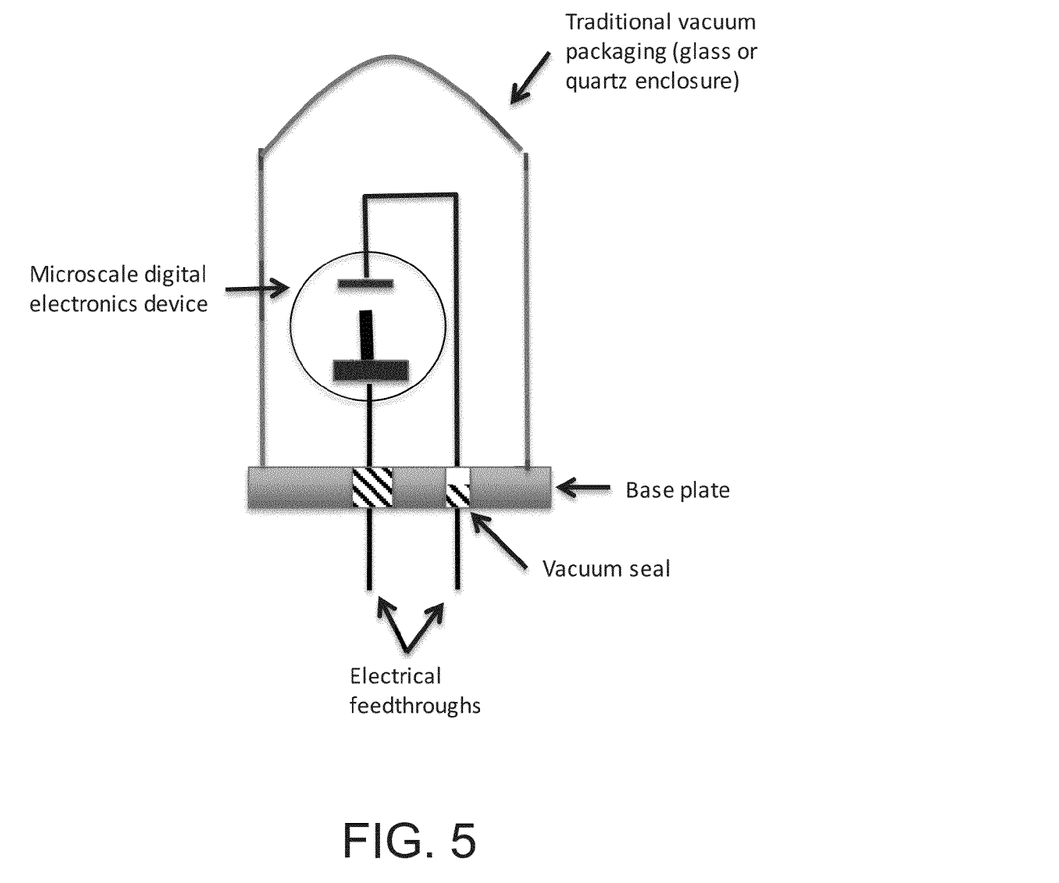
FIG. 5 illustrates how a microscale digital vacuum electronic gate can be packaged in accordance with embodiments of the invention.

Any suitable packaging materials can be used to package microscale digital vacuum electronic gates in accordance with embodiments of the invention. Again it is desirable that the packaging materials be capable of withstanding high temperature operation. For example, it is preferable that the housing should be able to maintain at least a partial vacuum even at high temperature. In some embodiments, a custom-designed quartz vacuum bulb package is used to package the electronic gate. FIG. 5 illustrates how an electronic gate may be packaged in accordance with some embodiments of the invention. In the illustrated embodiment, a quartz or special glass vacuum enclosure and pressed vacuum seal are used to preserve the vacuum that is achieved during the packaging process. Of course, although specific materials are referenced, any suitable packaging materials can be implemented in accordance with embodiments of the invention. For example, an Au/Sn alloy may be used to fabricate the packaging components that allow "chip-scale" packaging. Again it is preferable that the Au/Sn alloy be capable of high temperature operation. Accordingly, it is preferable to develop the Au/Sn alloy so that it can satisfy this goal.

The above-discussed microscale digital vacuum electronic gates are fundamental and can be used to develop advanced circuitry, and this is now discussed.

Advanced Electronic Circuitry

Figure 6:
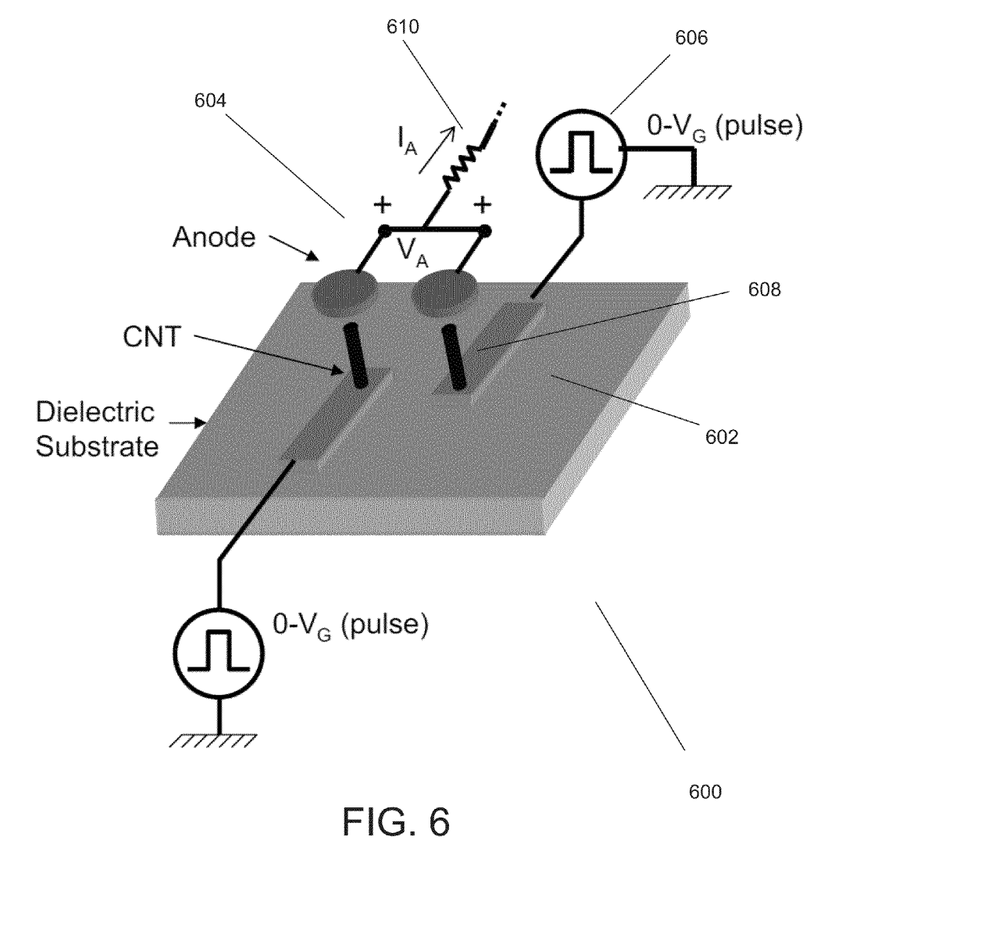
FIG. 6 illustrates an AND gate that can be constructed from microscale digital vacuum electronic gates in accordance with embodiments of the invention.

The above-discussed microscale digital vacuum electronic gates can be used as fundamental elements for the development of advanced electronic circuitry in accordance with embodiments of the invention. For example, in many embodiments an AND gate can be developed. FIG. 6 illustrates how an AND gate may be developed using microscale digital vacuum electronic gates in accordance with embodiments of the invention. In the illustrated embodiment, the AND gate includes two microscale digital vacuum electronic gates 602, that have coupled microscale anodes 604. Each electronic gate 602 includes a signal 606 as an input. In particular, the signal 606 is connected to the CNT Field emitter 608 of the electronic gate. The logic state can be correlated with the voltage difference across a resistor 610 that is electrically coupled to the electrically coupled anodes 604. Accordingly, when the signal 606 exceeds a threshold voltage, electrons are not emitted by the field emitter. Thus, when both signals 606 exceed a threshold voltage, current ceases to flow through the anode entirely, there's no voltage drop across the resistor 610, and a logic state of 1 is achieved. However, if either signal 606 is emitting a voltage that does not exceed the threshold voltage, then current will flow through the anode, there will be a voltage drop across the resistor 610, and a logic state of zero will result. In essence the following truth table will be achieved:

TABLE 1

AND Gate Truth Table

| Signal 1 | Signal 2 | Output |
|---|---|---|
| 0 | 0 | 0 |
| 0 | 1 | 0 |
| 1 | 0 | 0 |
| 1 | 1 | 1 |

Figure 7:
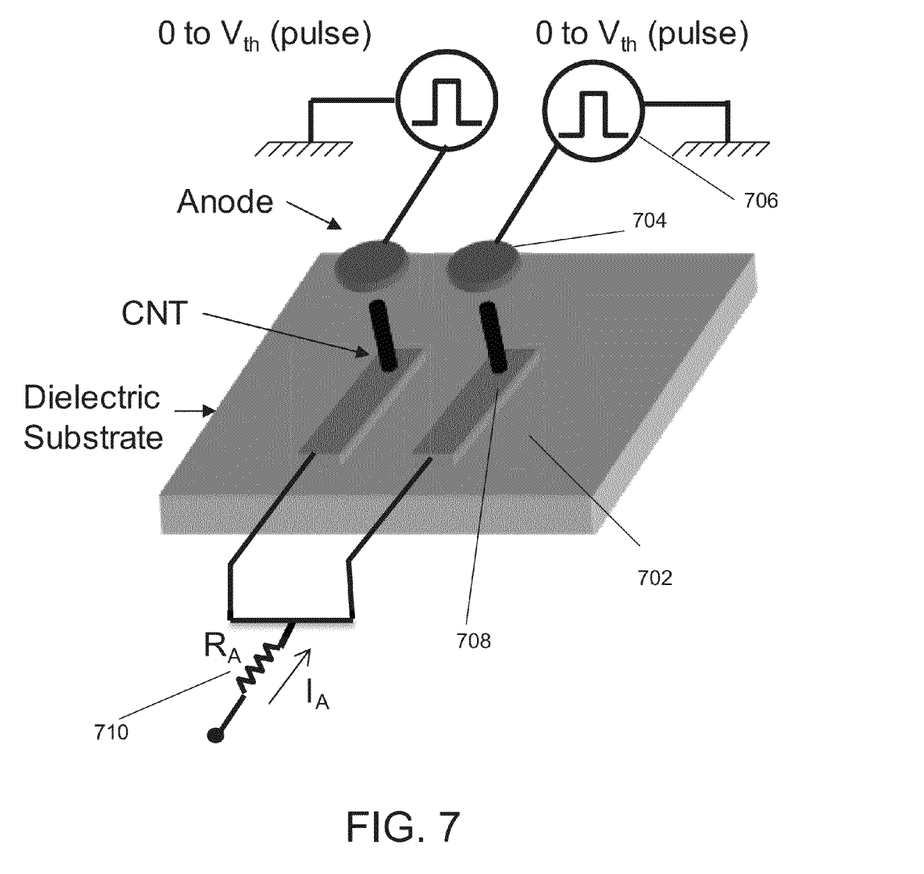
FIG. 7 illustrates an OR gate that can be constructed from microscale digital vacuum electronic gates in accordance with embodiments of the invention.

An OR gate can also be produced using microscale digital vacuum electronic gates in accordance with embodiments of the invention. For example, FIG. 7 illustrates how an OR gate may be produced using microscale digital vacuum electronic gates in accordance with embodiments of the invention. In the illustrated embodiment, the OR gate is similar to the AND gate seen in FIG. 6, except that two input signals 706 are electrically coupled to two respective microscale anodes 704 of two microscale digital vacuum electronic gates 702. Additionally, the microscale field emitters 708 of the two microscale digital vacuum gates 702 are electrically coupled (the microscale anodes are not electrically coupled), and a resistor 710 is electrically coupled to the electrically coupled microscale field emitters. The logic state can be correlated with the voltage drop across the resistor 710. Accordingly, when either of the two microscale anodes 704 receives a signal 706 that exceeds a threshold voltage, current flows through the anode and thereby across the resistor 710 that induces a voltage difference, and a logic state of 1 is achieved. Otherwise, when the microscale anodes 704 do not receive a signal greater than the threshold voltage, current does not flow, a voltage difference across the resistor 710 is not induced, and a logic state of 0 is achieved. In essence, the following truth table is achieved:

TABLE 2

OR Gate Truth Table

| Signal 1 | Signal 2 | Output |
|---|---|---|
| 0 | 0 | 0 |
| 0 | 1 | 1 |
| 1 | 0 | 1 |
| 1 | 1 | 1 |

Figure 8:
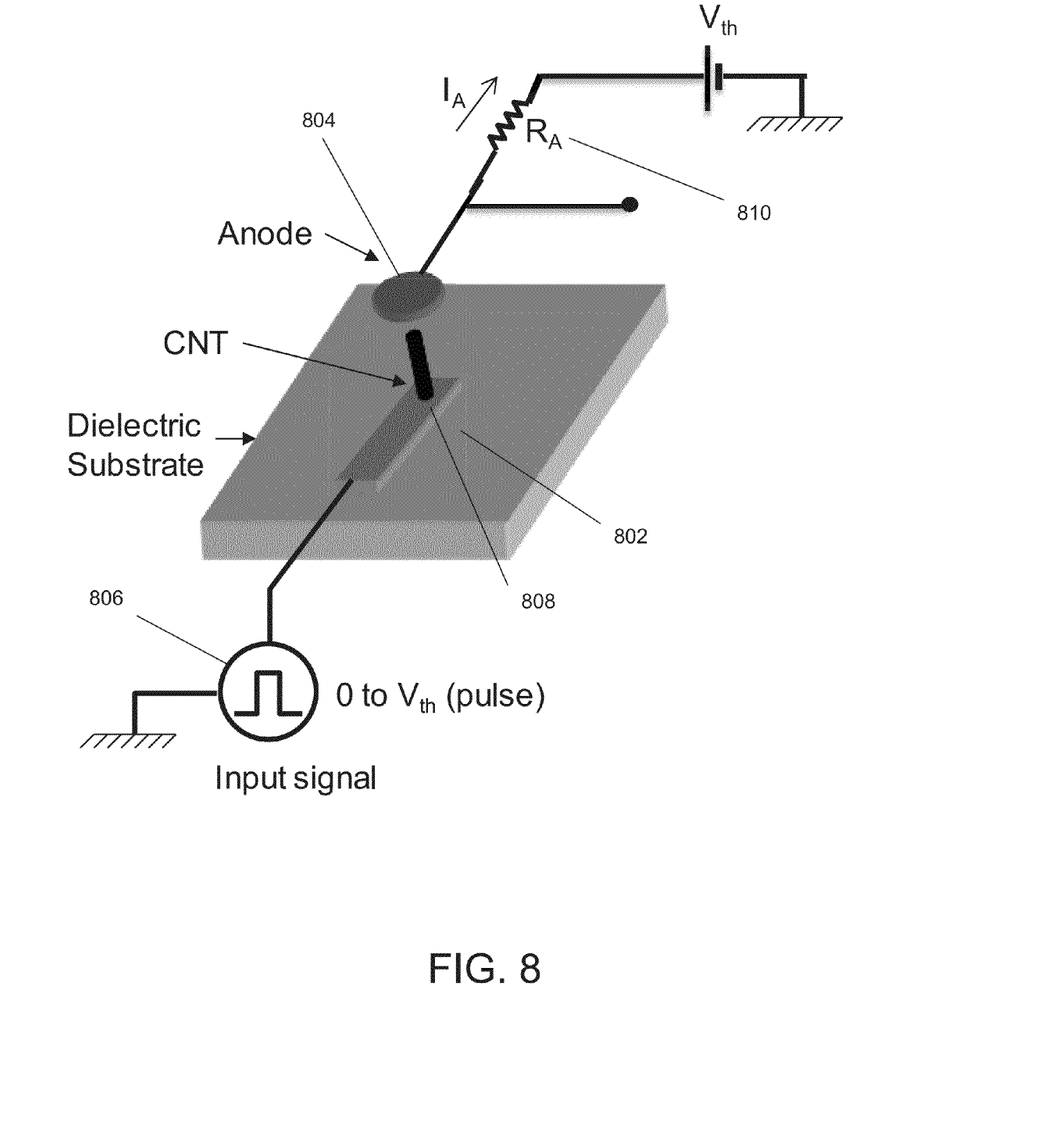
FIG. 8 illustrates a NOT gate that can be constructed from microscale digital vacuum electronic gates in accordance with embodiments of the invention.

A NOT gate can also be produced using a microscale digital vacuum electronic gate in accordance with embodiments of the invention. For example, FIG. 8 illustrates how a NOT gate may be produced using a microscale digital vacuum electronic gate in accordance with embodiments of the invention. In the illustrated embodiment, an input signal 806 is electrically coupled to the microscale field emitter 808 of a microscale digital vacuum electronic gate 802. The logic state can be correlated with the change in voltage across the resistor 810. The resistor is electrically coupled to the microscale anode 804 at one terminal, and is electrically coupled to a voltage source 812 at the other terminal. Accordingly, when the microscale field emitter 808 receives a signal 806 that exceeds a threshold voltage, current does not flow through the microscale anode 804, there is no voltage change across the resistor, and a logic state of 0 is achieved. Conversely, when the microscale field emitter 808 does not receive a signal 806 that exceeds a threshold voltage, current flows through the electronic gate and across the resistor 810 and causes a voltage difference, and a logic state of 1 is achieved. In essence, the following truth table is achieved:

TABLE 3

NOT Gate Truth Table

| Signal | Output |
|---|---|
| 0 | 1 |
| 1 | 0 |

Of course, as one of ordinary skill in the art would appreciate, the above-described AND Gates, OR Gates, and NOT gates can be combined to achieve more advanced gates. For example, NAND gates and NOR gates (which are universal logic gates) can be achieved by placing NOT gates in series with AND gates or OR gates, respectively. Similarly, any of the aforementioned logic gates can be used to create any desired complex logic circuitry, as would be appreciated by one of ordinary skill in the art.

As can be inferred from the above discussion, the above-mentioned concepts can be implemented in a variety of arrangements in accordance with embodiments of the invention. Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What claimed is:

1. A microscale digital vacuum electronic gate, comprising:
   a microscale field emitter that can emit electrons and that is a microscale cathode; and
   a microscale anode;
   wherein the microscale field emitter and the microscale anode are disposed within at least a partial vacuum;
   wherein the microscale field emitter and the microscale anode are separated by a gap; and
   wherein the potential difference between the microscale field emitter and the microscale anode is controllable such that the flow of electrons between the microscale field emitter and the microscale anode is thereby controllable;
   wherein when the microscale anode receives a flow of electrons, a first logic state is defined; and
   wherein when the microscale anode does not receive a flow of electrons, a second logic state is defined.

2. The microscale digital vacuum electronic gate of claim 1, wherein the microscale field emitter comprises a carbon nanotube.

3. The microscale digital vacuum electronic gate of claim 2, wherein the microscale field emitter comprises a bundle of carbon nanotubes.

4. The microscale digital vacuum electronic gate of claim 3, wherein the diameter of the bundle of carbon nanotubes is between approximately 1 μm and approximately 2 μm.

5. The microscale digital vacuum electronic gate of claim 4, wherein the microscale field emitter comprises an aggregate of bundles of carbon nanotubes.

6. The microscale digital vacuum electronic gate of claim 4, wherein the diameter of the aggregate of bundles of carbon nanotubes is approximately 100 μm.

7. The microscale digital vacuum electronic gate of claim 4, wherein the carbon nanotubes are coated with an atomic layer.

8. The microscale digital vacuum electronic gate of claim 7, wherein the coated atomic layer comprises one of: tungsten, molybdenum, and mixtures thereof.

9. The microscale digital vacuum electronic gate of claim 4, further comprising a resistor electrically coupled to the microscale anode.

10. The microscale digital vacuum electronic gate of claim 9, wherein the partial vacuum has a pressure of no greater than approximately $10^{-4}$ torr.

11. The microscale digital vacuum electronic gate of claim 10, wherein the partial vacuum is maintained using one of: a quartz vacuum bulb package; a specialized glass bulb package; chip scale packaging using standard multi-pin IC packages.

12. The microscale digital vacuum electronic gate of claim 10, wherein the potential difference is controlled by a signal that is electrically coupled to the microscale field emitter.

13. The microscale digital vacuum electronic gate of claim 12, further comprising a silica gel that is coupled to bundle of carbon nanotubes to hinder undesired displacement of the carbon nanotubes during operation of the microscale digital vacuum electronic gate.

14. The microscale digital vacuum electronic gate of claim 12, further comprising a conductive structure that is coated with an oxide layer.

15. The microscale digital vacuum electronic gate of claim 12, wherein the size of the microscale digital vacuum electronic gate is such that its footprint is less than approximately 100 square micrometers.

16. A microscale digital vacuum electronic logic circuit comprising:
   at least one microscale digital vacuum electronic gate, each comprising:
      a microscale field emitter that can emit electrons and that is a microscale cathode; and
      a microscale anode;
      wherein the microscale field emitter and the microscale anode are disposed within at least a partial vacuum;
      wherein the microscale field emitter and the microscale anode are separated by a gap;
      wherein the potential difference between the microscale field emitter and the microscale anode is controllable such that the flow of electrons between the microscale field emitter and the microscale anode is thereby controllable;
      wherein when the microscale anode receives a flow of electrons, a first logic state is defined; and
      wherein when the microscale anode does not receive a flow of electrons, a second logic state is defined;
   at least one resistor;
   wherein at least one microscale digital vacuum electronic gate and at least one resistor are electrically interconnected such that the combination of at least one microscale digital vacuum electronic gate and at least one resistor operates as a logic gate.

17. The microscale digital vacuum electronic logic circuit of claim 16, wherein the combination of at least one microscale digital vacuum electronic gate and at least one resistor operates as at least one logic gate selected from the group consisting of: AND Gate, OR Gate, NAND Gate, NOR Gate, and NOT gate.

18. The microscale digital vacuum electronic logic circuit of claim 16, comprising:
   a first microscale digital vacuum electronic gate; and
   a second microscale digital vacuum electronic gate;
   wherein the microscale anode of the first microscale digital vacuum electronic gate is electrically coupled to the microscale anode of the second microscale digital vacuum electronic gate such that the two respective microscale anodes are at substantially the same electric potential;

wherein a resistor is electrically coupled to the electrically coupled anodes;

wherein the combination of the first microscale digital vacuum electronic gate, the second microscale digital vacuum electronic gate, and the resistor is defined to be a microscale digital vacuum AND gate;

wherein when either the first microscale digital vacuum electronic gate or the second microscale digital vacuum electronic gate is in a first logic state, then the microscale digital vacuum AND gate is defined to be in a first logic state; and wherein when both the first microscale digital vacuum electronic gate and the second microscale digital vacuum electronic gate are in a second logic state, then the microscale digital vacuum AND gate is defined to be in a second logic state.

19. The microscale digital vacuum electronic logic circuit of claim 18, wherein
the potential difference between the microscale field emitter of the first microscale digital vacuum electronic gate and the electrically coupled microscale anodes is controlled by a first signal; and
the potential difference between the microscale field emitter of the second microscale digital vacuum electronic gate and the electrically coupled microscale anodes is controlled by a second signal.

20. The microscale digital vacuum electronic logic circuit of claim 16, comprising:
a first microscale digital vacuum electronic gate; and
a second microscale digital vacuum electronic gate;
wherein the microscale field emitter of the first microscale digital vacuum electronic gate is electrically coupled to the microscale field emitter of the second microscale digital vacuum electronic gate such that the two respective microscale field emitters are at substantially the same electric potential;
wherein a resistor is electrically coupled to the electrically coupled field emitters;
wherein the combination of the first microscale digital vacuum electronic gate, the second microscale digital vacuum electronic gate, and the resistor is defined to be a microscale digital vacuum OR gate;
wherein when both the first microscale digital vacuum electronic gate and the second microscale digital vacuum electronic gate are in a first logic state, then the microscale digital vacuum OR gate is defined to be in a first logic state; and
wherein when either the first microscale digital vacuum electronic gate or the second microscale digital vacuum electronic gate is in a second logic state, then the microscale digital vacuum OR gate is defined to be in a second logic state.

21. The microscale digital vacuum electronic logic circuit of claim 20, wherein
the potential difference between the electrically coupled microscale field emitters and the microscale anode of the first microscale digital vacuum electronic gate is controlled by a first signal; and
the potential difference between the electrically coupled microscale field emitters and the microscale anode of the second microscale digital vacuum electronic gate is controlled by a second signal.

22. The microscale digital vacuum electronic logic circuit of claim 16, wherein:
the microscale anode of a microscale digital vacuum electronic gate is electrically coupled to a resistor's first terminal;
wherein a voltage source is electrically coupled to the resistor's second terminal;
wherein the combination of the microscale digital vacuum electronic gate, the resistor, and the voltage source is defined to be a microscale digital vacuum NOT gate;
wherein when the microscale digital vacuum electronic gate is in a second logic state, the microscale digital vacuum NOT gate is defined to be in a first logic state;
wherein when the microscale digital vacuum electronic gate is in a first logic state, the microscale digital vacuum NOT gate is defined to be in a second logic state.

23. The microscale digital vacuum electronic logic circuit of claim 22, wherein the potential difference between the microscale field emitter of the microscale digital vacuum electronic gate and the microscale anode of the microscale digital vacuum electronic gate is controlled by a signal.

24. A microscale digital vacuum AND gate comprising:
at least two microscale digital vacuum electronic gates, each comprising:
a microscale field emitter that can emit electrons and that is a microscale cathode; and
a microscale anode;
wherein the microscale field emitter and the microscale anode are disposed within at least a partial vacuum;
wherein the microscale field emitter and the microscale anode are separated by a gap;
wherein the potential difference between the microscale field emitter and the microscale anode is controllable such that the flow of electrons between the microscale field emitter and the microscale anode is thereby controllable;
wherein when the microscale anode receives a flow of electrons, a first logic state is defined; and
wherein when the microscale anode does not receive a flow of electrons, a second logic state is defined;
wherein the microscale anode of a first microscale digital vacuum electronic gate is electrically coupled to the microscale anode of a second microscale digital vacuum electronic gate such that the microscale anodes are at substantially the same electric potential;
wherein a resistor is electrically coupled to the electrically coupled microscale anodes;
wherein when either the first microscale digital vacuum electronic gate or the second digital vacuum electronic gate is in a first logic state, then the microscale digital vacuum AND gate is defined to be in a first logic state; and
wherein when both the first microscale digital vacuum electronic gate and the second microscale digital vacuum electronic gate are in a second logic state, then the microscale digital vacuum AND gate is defined to be in a second logic state.

25. The microscale digital vacuum AND gate of claim 24, wherein:
the potential difference between the first microscale field emitter and the electrically coupled microscale anodes is controlled by a first signal; and
the potential difference between the second microscale field emitter and the electrically coupled microscale anodes is controlled by a second signal.

26. A microscale digital vacuum OR gate comprising:
at least two microscale digital vacuum electronic gates, each comprising:
a microscale field emitter that can emit electrons and that is a microscale cathode; and
a microscale anode;
wherein the microscale field emitter and the microscale anode are disposed within at least a partial vacuum;
wherein the microscale field emitter and the microscale anode are separated by a gap;
wherein the potential difference between the microscale field emitter and the microscale anode is controllable such that the flow of electrons between the microscale field emitter and the microscale anode is thereby controllable;
wherein when the microscale anode receives a flow of electrons, a first logic state is defined; and
wherein when the microscale anode does not receive a flow of electrons, a second logic state is defined;
wherein the microscale field emitter of a first microscale digital vacuum electronic gate is electrically coupled to the microscale field emitter of a second microscale digital vacuum electronic gate such that the microscale field emitters are at substantially the same electric potential;
wherein a resistor is electrically coupled to the electrically coupled microscale field emitters;
wherein when both the first microscale digital vacuum electronic gate and the second microscale digital vacuum electronic gate are in a first logic state, then the microscale digital vacuum OR gate is defined to be in a first logic state; and
wherein when either the first microscale digital vacuum electronic gate or the second microscale digital vacuum electronic gate is in a second logic state, then the microscale digital vacuum OR gate is defined to be in a second logic state.

27. The microscale digital vacuum OR logic gate of claim 26, wherein:
the potential difference between the electrically coupled microscale field emitters and the first microscale anode is controlled by a first signal; and
the potential difference between the electrically coupled microscale field emitters and the second microscale anode is controlled by a second signal.

28. A microscale digital vacuum NOT gate comprising:
a microscale digital vacuum electronic gates, itself comprising:
a microscale field emitter that can emit electrons and that is a microscale cathode; and
a microscale anode;
wherein the microscale field emitter and the microscale anode are disposed within at least a partial vacuum;
wherein the microscale field emitter and the microscale anode are separated by a gap;
wherein the potential difference between the microscale field emitter and the microscale anode is controllable such that the flow of electrons between the microscale field emitter and the microscale anode is thereby controllable;
wherein when the microscale anode receives a flow of electrons, a first logic state is defined; and
wherein when the microscale anode does not receive a flow of electrons, a second logic state is defined;
a resistor having a first terminal and a second terminal;
a voltage source;
wherein the resistor is electrically coupled to the microscale anode at its first terminal;
wherein the resistor is electrically coupled to the voltage source at its second terminal;
wherein when the microscale digital vacuum electronic gate is in a second logic state, then the microscale digital vacuum NOT gate is defined to be in a first logic state; and
wherein when the microscale digital vacuum electronic gate is in a first logic state, then the microscale digital vacuum NOT gate is defined to be in a second logic state.

29. The microscale digital vacuum NOT gate of claim 28, wherein:
the potential difference between the microscale field emitter and the microscale field anode is controlled by a signal.

* * * * *

UNITED STATES PATENT AND TRADEMARK OFFICE
CERTIFICATE OF CORRECTION

PATENT NO. : 8,796,932 B2
APPLICATION NO. : 13/796943
DATED : August 5, 2014
INVENTOR(S) : Harish Manohara et al.

It is certified that error appears in the above-identified patent and that said Letters Patent is hereby corrected as shown below:

In the Claims

Column 13, line 30, change "What claimed is:" to "What is claimed is:"

Column 14, line 19, add "a" in front of "bundle of"

Column 18, line 5, change "gates" to "gate"

Signed and Sealed this
Twenty-first Day of April, 2015

Michelle K. Lee
*Director of the United States Patent and Trademark Office*